United States Patent [19]
Hazen et al.

[11] Patent Number: 6,150,835
[45] Date of Patent: Nov. 21, 2000

[54] METHOD AND APPARATUS FOR FAST PRODUCTION PROGRAMMING AND LOW-VOLTAGE IN-SYSTEM WRITES FOR PROGRAMMABLE LOGIC DEVICE

[75] Inventors: Peter K. Hazen, Auburn; Sandeep K. Guliani, Folsom; Robert E. Larsen, Shingle Springs, all of Calif.

[73] Assignee: Intel Corporation, Santa Clara, Calif.

[21] Appl. No.: 09/075,430

[22] Filed: May 8, 1998

[51] Int. Cl.[7] .................. H03K 19/173; H03K 19/177; H03K 5/22; H01L 25/00
[52] U.S. Cl. ........................ 326/38; 326/41; 326/47; 327/74
[58] Field of Search .................. 326/38, 41, 47; 327/74, 76, 536; 365/226, 189.09

[56] References Cited

U.S. PATENT DOCUMENTS

| | | | |
|---|---|---|---|
| 4,859,872 | 8/1989 | Hyakutake | 327/28 |
| 5,420,798 | 5/1995 | Lin et al. | 364/483 |
| 5,442,586 | 8/1995 | Javanifard et al. | 365/185 |
| 5,528,546 | 6/1996 | Chao et al. | 365/185.21 |
| 5,594,360 | 1/1997 | Wojciechowski | 324/771 |
| 5,602,794 | 2/1997 | Javanifard et al. | 365/226 |
| 5,661,685 | 8/1997 | Lee et al. | 365/185.22 |
| 5,767,735 | 6/1998 | Javanifard et al. | 327/536 |
| 5,781,473 | 7/1998 | Javanifard et al. | 365/185.18 |

*Primary Examiner*—Michael Tokar
*Assistant Examiner*—Daniel D. Chang
*Attorney, Agent, or Firm*—Calvin E. Wells

[57] ABSTRACT

A programmable logic device that includes a voltage input and a detection circuit coupled to the voltage input is described. The detection circuit detects whether a voltage applied to the voltage input exceeds a predetermined value. The programmable logic device also includes a configuration circuit coupled to the detection circuit. The configuration circuit configures the programmable logic device to receive a current sufficient for program and erase operations through the voltage input in response to the detection circuit detecting that the voltage exceeds the predetermined value.

11 Claims, 5 Drawing Sheets

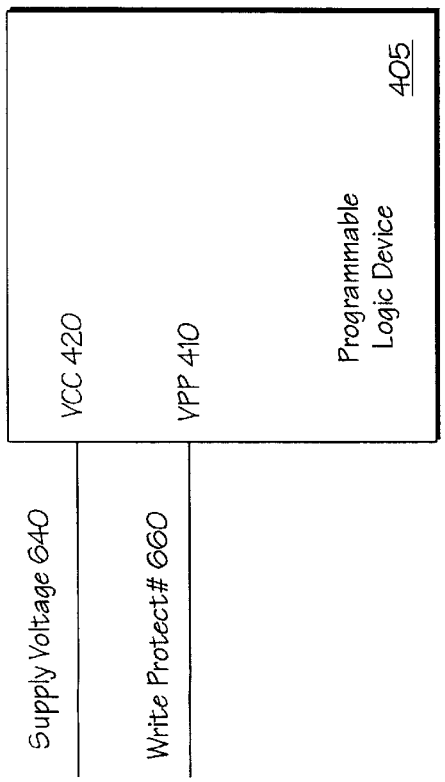
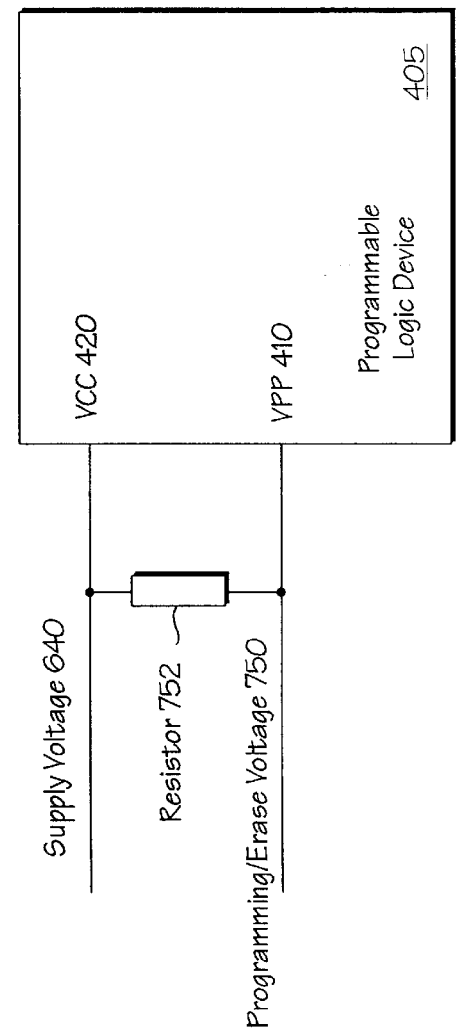

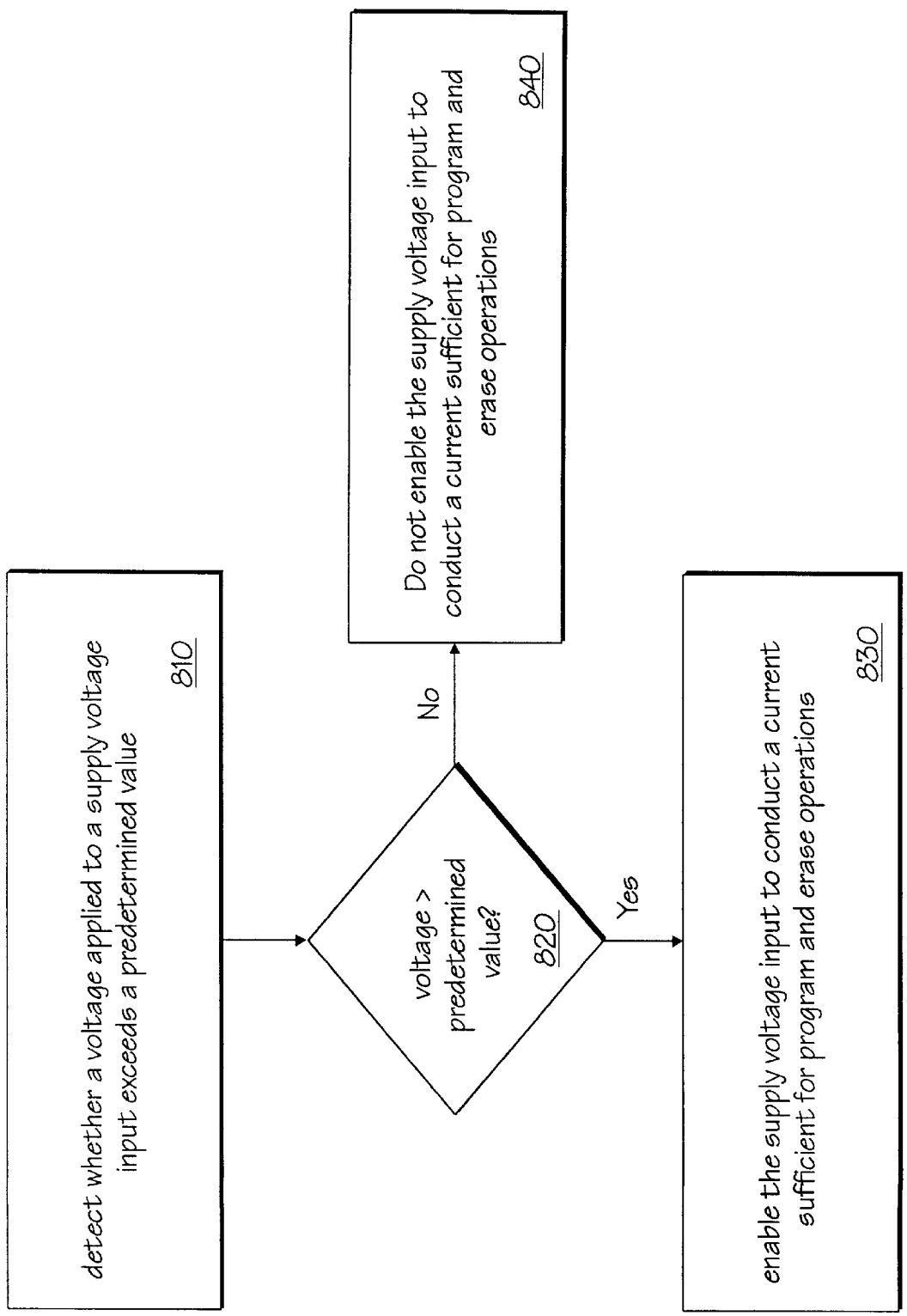

METHOD AND APPARATUS FOR FAST PRODUCTION PROGRAMMING AND LOW-VOLTAGE IN-SYSTEM WRITES FOR PROGRAMMABLE LOGIC DEVICE

FIELD OF THE INVENTION

The present invention pertains to the field of programmable logic devices. More particularly, this invention pertains to the field of automatically configuring programmable logic devices for fast production programming and low-voltage in-system writes.

BACKGROUND OF THE INVENTION

Programmable logic devices often include two separate power supply inputs. A system supply voltage, typically 3.3 V or 5 V, is provided to a first power supply input to provide current for read operations. Another voltage, typically 12 V or a voltage equal in value to the system supply voltage, is provided to a second power supply input. This voltage is provided for program and erase operations. A 12 V supply applied to the second power supply input will allow the programmable logic device to perform fast program and erase operations, while a voltage equal in value to the system supply voltage applied to this input will allow slower program operations. Typically, the 12 V supply is used to program the programmable logic device during production, thereby improving production throughput and minimizing production equipment costs. For typical in-system operations, 3.3 V or 5 V system supply voltage is applied to the second power supply input. In order to allow for fast programming during production and programming during normal in-system operation, a computer system manufacturer must implement system level circuitry to allow 12 V to be applied to the second power supply input during production and to cause the system supply voltage to be applied to the second power supply input during computer system operation. The system level circuitry may also include circuitry to provide a write-protection function by connecting the second power supply input to ground, thereby disallowing any write operations.

FIG. 1 shows a typical arrangement for a prior art programmable logic device 110 in a computer system. The programmable logic device 110 includes a system supply voltage input (VCC) 120 and a program and erase voltage input (VPP) 130. For this arrangement, VCC 120 is connected to VPP 130. VCC 120 and VPP 130 each receive a system supply voltage 140, which is typically 5 V, although 3.3 V is also typical. This implementation does not allow for fast programming, since no 12 V supply is provided. Also, no write protection is possible since VPP 130 is always equal to VCC 120, thereby enabling in-system programming and erase operations.

FIG. 2 depicts an additional typical arrangement for a prior art programmable logic device 110 in a computer system. As in FIG. 1, the programmable logic device 110 includes a VCC input 120 and a VPP input 130. For this implementation, a system supply voltage 140, typically 5 V or 3.3 V, is applied to VCC 120. A program and erase voltage 250, typically 12 V, is applied to VPP 130. VPP 130 is also connected to ground through a resistor 252. This implementation allows for fast production programming since VPP 130 receives 12 V. This implementation also provides write protection since when the programming and erase voltage 250 is not being applied to VPP 130, VPP 130 is left floating and is tied to ground through the resistor 252. This implementation has the disadvantage of not allowing in-system program and erase operations, since there is no provision for providing the system supply voltage 140 to VPP 130.

FIG. 3 illustrates an arrangement for a prior art programmable logic device 110 that allows for write protection, fast production program and erase operations, and in-system program and erase operations. For this arrangement, a supply voltage 140, typically 5 V or 3.3 V, is provided to VCC 120 and to a transistor 370. A system logic 360 is provided to enable transistor 370 when in-system program and erase operations are desired. When the transistor 370 is enabled, the system supply voltage 140 is delivered to VPP 130, thus enabling in-system program and erase operations. When the transistor 370 is not enabled, VPP 130 is normally tied to ground through resistor 252, thereby providing write protection by disabling programming and erase operations. With the transistor 370 disabled, it is also possible to apply a program and erase voltage 250 to VPP 130 during production, thereby enabling fast production program and erase operations. While this arrangement allows for fast production program and erase operations, in-system program and erase operations, and write protection, these features are available only at the extra cost of providing the system logic 360, the transistor 370, and the resistor 252.

SUMMARY OF THE INVENTION

A programmable logic device is disclosed. The programmable logic device includes a first voltage input and a first detection circuit coupled to the first voltage input. The first detection circuit detects whether a voltage applied to the first voltage input exceeds a first predetermined value. The programmable logic device also includes a first configuration circuit coupled to the first detection circuit. The first configuration circuit configures the programmable logic device to receive a current sufficient for program and erase operations through the first voltage input in response to the first detection circuit detecting that the voltage exceeds the first predetermined value.

Other features and advantages of the invention will be apparent from the accompanying drawings and from the detailed description that follows below.

BRIEF DESCRIPTION OF THE DRAWINGS

The invention is illustrated by way of example and not limitation in the figures of the accompanying drawings, in which like references indicate similar elements, and in which:

FIG. 6 depicts a programmable logic device connected to a supply voltage and a write protect logic signal.

FIG. 7 illustrates a programmable logic device connected to a supply voltage and a program and erase voltage.

FIG. 8 is a flow diagram of a method for automatically configuring a first voltage input and a second voltage input of a programmable logic device.

DETAILED DESCRIPTION

One embodiment of the invention provides circuitry for automatically configuring a programmable logic device to receive a current sufficient for program and erase operations through either a program and erase voltage input or a system supply voltage input, depending on the voltage level applied to the program and erase voltage input. Another embodiment of the invention further provides for program and erase protection by using the program and erase supply voltage input as a logic level write protect input. An intended advantage of one embodiment is providing fast production programming and in-system program and erase operations without the extra cost of system level logic circuitry. An additional intended advantage of one embodiment is providing complete program and erase protection through a simple logic signal input.

Figure 1:
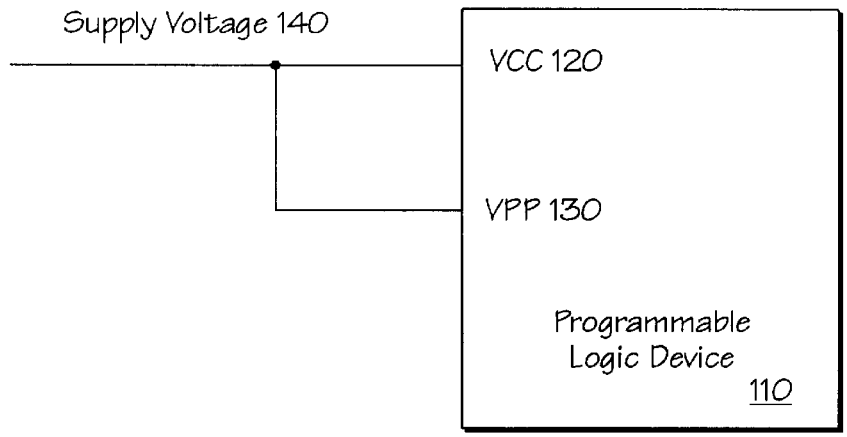
FIG. 1 shows a typical system implementation of a prior art programmable logic device.
Figure 2:
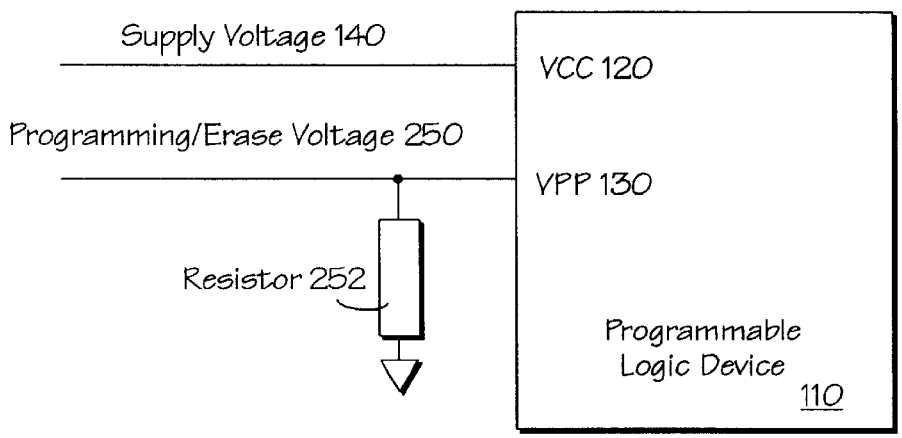
FIG. 2 depicts an additional typical system implementation of a prior art programmable logic device.
Figure 3:
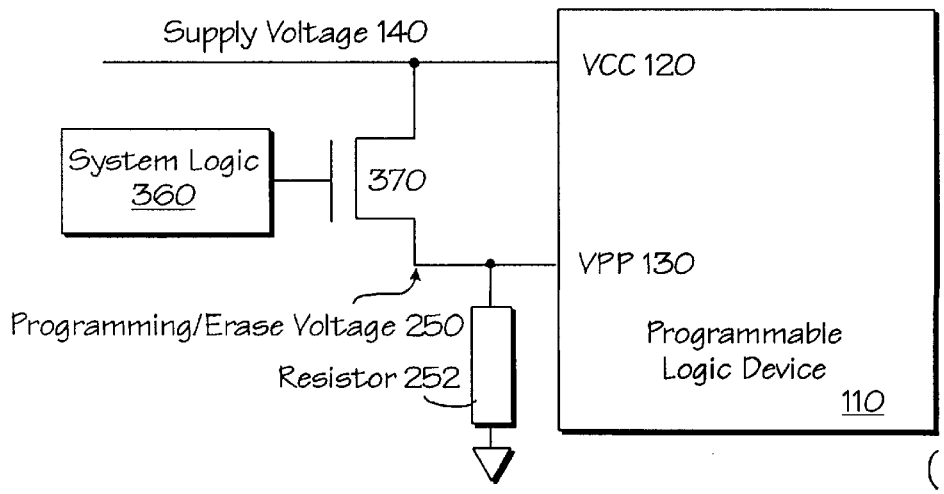
FIG. 3 shows an additional typical system implementation of a prior art programmable logic device including system logic.
Figure 4:
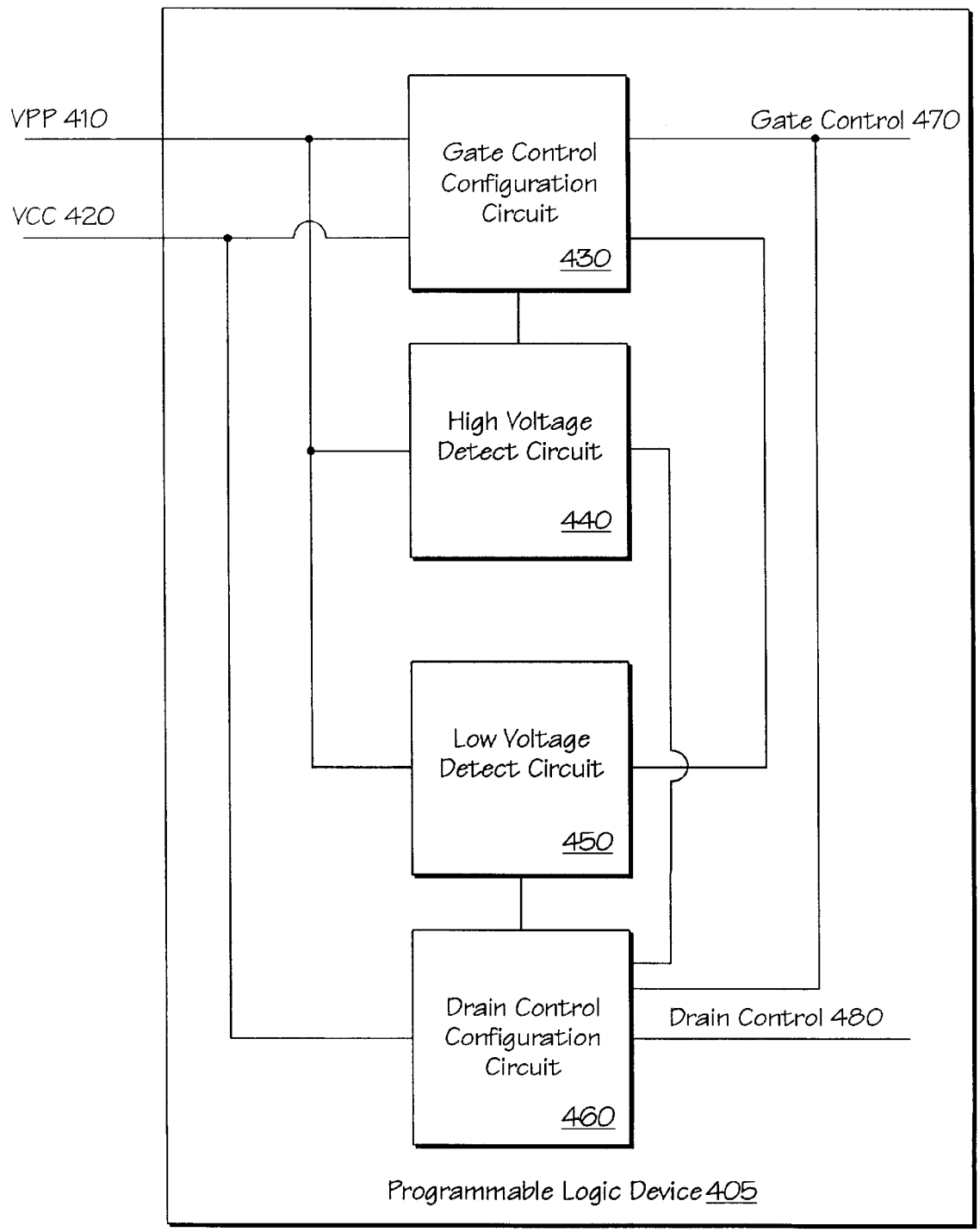
FIG. 4 illustrates a block diagram of one embodiment of a programmable logic device.

FIG. 4 is a block diagram of one embodiment of a programmable logic device 405. The programmable logic device 405 for this embodiment is a flash type non-volatile memory device, but other embodiments are possible using any programmable logic device that includes a voltage input for program and erase operations and a separate voltage input for other device operations. The term "programmable logic device" as used herein is meant to include a broad range of programmable electrical devices, including, but not limited to, flash and other non-volatile memory devices. The programmable logic device 405 includes a program and erase voltage input (VPP) 410 and a system supply voltage input (VCC) 420. VCC 420 preferably receives a voltage of approximately 5 V, although alternative embodiments have a VCC 420 that receives a range of voltages, including, but not limited to, 3.3 V. Other embodiments may have a VCC 420 that receives approximately 1.8 V. During device operation, VPP 410 may receive 0 V, a voltage equal to VCC, or a higher voltage for fast programming. The higher voltage for fast programming is preferably 12 V, although alternative embodiments use other voltages.

The programmable logic device 405 further includes a high voltage detect circuit 440, a low voltage detect circuit 450, a gate control configuration circuit 430, and a drain control configuration circuit 460. The gate control configuration circuit 430 outputs a gate control signal 470, while the drain control configuration circuit 460 outputs a drain control signal 480. The gate control signal 470 provides the voltage necessary for program and erase operations to the gates of the transistors (not shown) that make up the programmable logic device's memory cells (also not shown). The drain control signal 480 provides the voltage necessary for program and erase operations to the drains of the transistors that make up the programmable logic device's memory cells.

The high voltage detect circuit 440 receives the VPP input 410 and determines whether a voltage applied to the VPP input 410 exceeds a predetermined voltage level. For implementations where the higher voltage for fast production programming is 12 V, the high voltage detect circuit predetermined voltage level is preferably 8 V, although other levels are possible. The high voltage detect circuit 440 is coupled to the gate control configuration circuit 430, and the high voltage detect circuit 440 communicates the results of the determination to the gate control configuration circuit 430. If the high voltage detect circuit 440 determines that the voltage applied to the VPP input 410 exceeds 8 V, then the gate control configuration circuit 430 allows the voltage applied to the VPP input 410 to pass through to the gate control signal 470. The high voltage detect circuit 440 is further coupled to the drain control configuration circuit 460, and the high voltage detect circuit 440 communicates the results of the determination to the drain control configuration circuit 460. If the high voltage detect circuit 440 determines that the voltage applied to the VPP input 410 exceeds 8 V, then the drain control configuration circuit 430 allows the voltage passed through to the gate control signal 470 to pass through to the drain control signal 480.

The low voltage detect circuit 450 also receives the VPP input 410 and determines whether the voltage applied to the VPP input 410 is less than a predetermined level. The predetermined level is preferably 1 V, although other levels are possible. The low voltage detect circuit 450 is coupled to both the gate control configuration circuit 430 and the drain control configuration circuit 460, and communicates the results of the determination to each of configuration circuits 430 and 460. If the low voltage detect circuit 450 determines that the voltage applied to the VPP input 410 is less than 1 V, then the gate control configuration circuit 430 and the drain control configuration circuit 460 each prevent the voltage applied to the VPP input 410 and a voltage applied to the VCC input 420 from passing through to the gate control signal 470 and the drain control signal 480. Therefore, a logically low signal delivered to the VPP input 410 prevents program and erase operations, thereby providing complete write protection for the programmable logic device 405.

In the event that the high voltage detect circuit 440 determines that the voltage applied to the VPP input 410 does not exceed 8 V and the low voltage detect circuit 450 determines that the voltage applied to the VPP input 410 is not less than 1 V, the gate control configuration circuit 430 and the drain control configuration circuit 460 cause the voltage applied to the VCC input 420 to be used for program and erase operations. Therefore, a logically high voltage level between 1 V and 8 V will allow in-system program and erase operations by causing the programmable logic device 405 to use the voltage applied to the VCC input 420 for program and erase operations. The programmable logic device 405 may include charge pumps (not shown in FIG. 4, but see FIG. 5) for the drain and gate control signals 480 and 470 in order to take the voltage applied to the VCC input 420 and provide appropriate voltage and current levels for program and erase operations.

Figure 5:
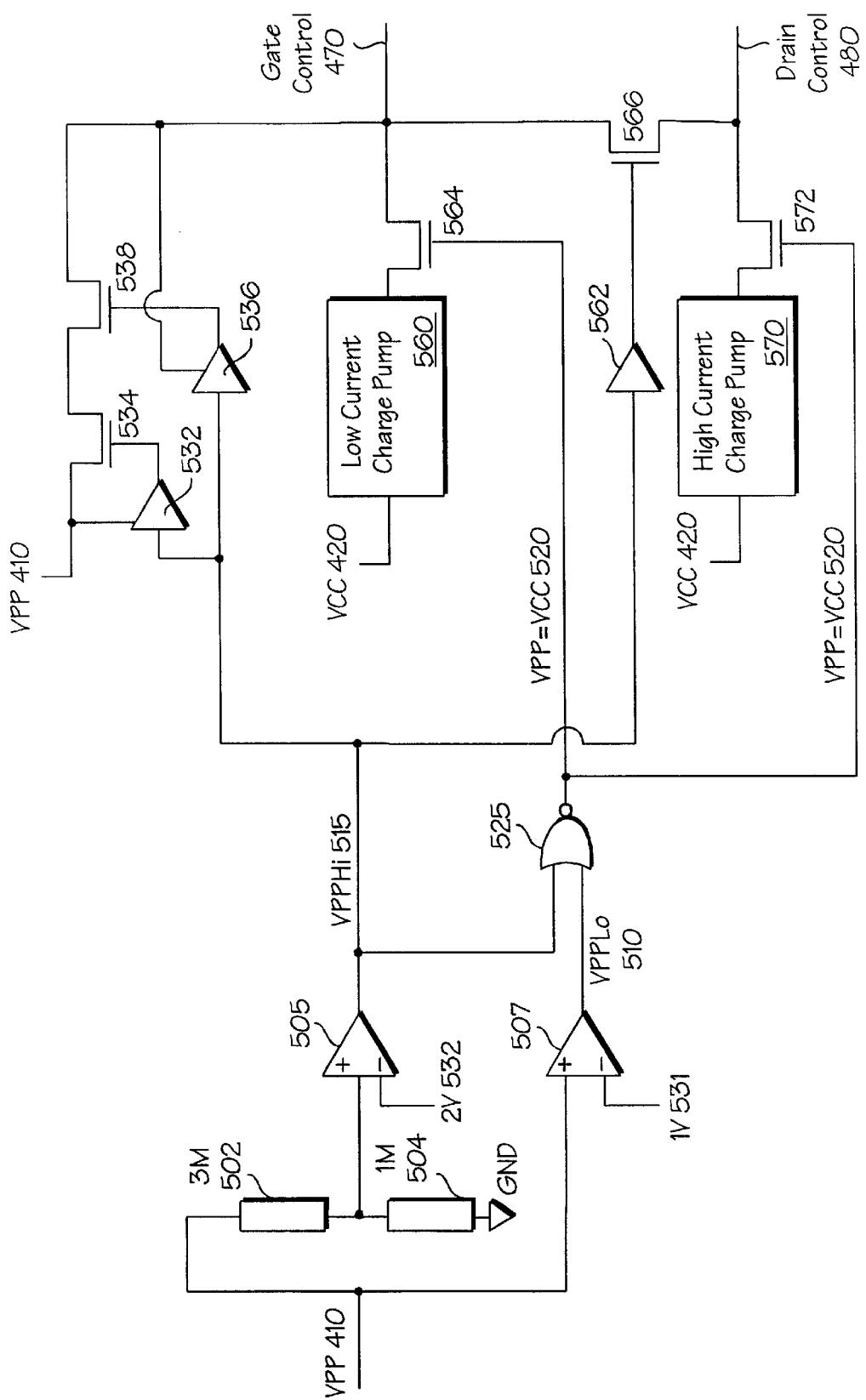
FIG. 5 shows a diagram of one embodiment of detection and configuration circuits included in a programmable logic device.

FIG. 5 shows a diagram of detection and configuration circuits included in a programmable logic device. The diagram of FIG. 5 is a more detailed view of the circuits discussed above with respect to FIG. 4. A voltage is received at a VPP input 410. A 3 MΩ resistor 502 and a 1 MΩ resistor 504 form a voltage divider circuit that divides the voltage received at the VPP input 410 by 4. Although specific values for resistors 502 and 504 are disclosed, the voltage divider circuit may be implemented using other resistor values or any other techniques or devices for dividing a voltage.

The output of the voltage divider circuit formed by the resistors 502 and 504 is received by a comparator circuit 505. The comparator circuit 505 compares the output of the voltage divider circuit formed by the resistors 502 and 504 with a 2 V reference voltage 532. Since the voltage divider formed by resistors 502 and 504 divides the voltage applied to the VPP input 410 by 4, the comparator circuit 505 can determine whether the voltage applied to the VPP input 410 is greater than 8 V. For example, if the voltage applied to the VPP input 410 is 12 V, the voltage divider formed by resistors 502 and 504 would deliver a voltage of 3 V to the comparator circuit 505. Since 3 V exceeds the 2 V reference voltage 532, the comparator circuit 505 will assert a signal VPPHi 515 which indicates that a voltage exceeding 8 V is applied to the VPP input 410. If the voltage applied to the VPP input 410 is less than 8 V, the comparator will deassert the VPPHi signal 515.

The comparator circuit 507 compares the voltage applied to the VPP input 410 with a 1 V reference voltage. If the voltage applied to the VPP input 410 is less than 1 V, the comparator circuit 507 will assert a signal VPPLo 510 indicating that a voltage less than 1 V is applied to the VPP input 410. The comparator circuit 507 will deassert the VPPLo signal 510 if the voltage applied to the VPP input 410 exceeds 1 V.

The VPPHi signal 515 is coupled to level shifters 532, 536, and 562. Because the signal VPPHi 515 is asserted only when the voltage applied to the VPP input 410 is greater than 8 V, the level shifters 532, 536, and 562 are necessary to allow the logic signal VPPHi 515 to enable transistors 534, 566, and 538 which, when enabled, couple the voltage applied to the VPP input 410 to a gate control signal 470 and a drain control signal 480. As described above in connection with FIG. 4, the gate control signal 470 provides the voltage necessary for program and erase operations to the gates of the transistors (not shown) that make up the programmable logic device's memory cells (also not shown). The drain control signal 480 provides the voltage necessary for program and erase operations to the drains of the transistors that make up the programmable logic device's memory cells.

When the VPPHi signal 515 is deasserted, indicating that the voltage applied to the VPP input 410 is less than 8 V, and the VPPLo signal 510 is also deasserted, indicating that the voltage applied to the VPP input 410 is greater than 1 V, a NOR gate 525, which receives both the VPPHi signal 515 and the VPPLo signal 510, will assert a VPP=VCC signal 520. The assertion of the VPP=VCC signal 520 indicates that the voltage applied to the VPP input 410 is approximately equal to the voltage applied to a VCC input 420.

The VCC input 420 supplies the voltage necessary for read operations and also provides power for a low current charge pump 560 and a high current charge pump 570. When the voltage applied to the VPP input 410 is less than 12 V and greater than 1 V, the voltage for program and erase operations is provided by the VCC input 410. The low current charge pump 560 provides the current necessary for program and erase operations to the gates of the transistors (not shown) that make up the programmable logic device's memory cells (also not shown). The gate current is delivered via the gate control signal 470 when a transistor 564 is enabled. The high current charge pump 570 provides the current necessary for program and erase operations to the drains of the transistors that make up the programmable logic device's memory cells. The drain current is delivered via the drain control signal 480 when a transistor 572 is enabled. The transistors 564 and 572 are coupled to the VPP=VCC signal 520 and are enabled when the VPP=VCC signal 520 is asserted.

FIG. 6 depicts a programmable logic device 405 as described above in connection with FIGS. 4 and 5. The programmable logic device 405 includes a VCC input 420 and a VPP input 410. The VCC input 420 is connected to a supply voltage 640 and the VPP input 410 is connected to a write protect logic signal 660. The supply voltage 640 is preferably 5 V, although other voltages are possible, including 3.3 V. When the write protect signal 660 is at a logically low voltage level, the programmable logic device 405 is prevented from performing program and erase operations as described above in connection with FIGS. 4 and 5. When the write protect signal 660 is at a logically high voltage level (but lower than 8 V), the programmable logic device 405 receives the power necessary for program and erase operations through the VCC input 420, also described above in connection with FIGS. 4 and 5. Thus, it can be seen that complete write protection is provided via a simple logic signal and also in-system program and erase is provided without external circuitry.

FIG. 7 illustrates a programmable logic device 405 as described above in connection with FIGS. 4 and 5. The programmable logic device 405 includes a VCC input 420 and a VPP input 410. The VCC input 420 is connected to a supply voltage 640. The supply voltage 640 is preferably 5 V, although other voltages are possible, including 3.3 V. Other embodiments may use a supply voltage of approximately 1.8 V. The VPP input 410 is connected to a programming and erase voltage line 750. The programming and erase voltage 750 is preferably 12 V, but other voltages are possible. A resistor 752 is coupled between the supply voltage 640 and the program and erase voltage 750. During production, 12 V may be applied to the VPP input 410 via the program and erase voltage line 750. This enables the programmable logic device 405 to perform fast program and erase operations. When the programmable logic device 405 is used during in-system operation, no program and erase current is delivered via the program and erase voltage line 750. During in-system operation, the VPP input 410 receives the supply voltage 640 through the resistor 752. The value of the resistor 752 should preferably be one that will minimize the voltage drop across the resistor 752. Because the supply voltage is less than 8 V and greater than 1 V, the programmable logic device will use the voltage applied to the VCC input 420 for in-system program and erase operations. Therefore, the embodiment of FIG. 7 provides fast production programming and in-system program and erase operations using only the low-cost resistor 752 for external circuitry.

FIG. 8 is a flow diagram of a method for automatically configuring a first supply voltage input and a second supply voltage input of a programmable logic device. At steps 810 and 820, a determination is made whether a voltage applied to a supply voltage input exceeds a predetermined value. Step 830 indicates that if the supply voltage exceeds the predetermined value, the supply voltage input is enabled to conduct a current sufficient for program and erase operations. If the voltage does not exceed the predetermined value, the supply voltage input is not enabled to conduct the current necessary for program and erase operations.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A programmable logic device, comprising:
   a first voltage input;
   a second voltage input;
   a first detection circuit coupled to the first voltage input, the first detection circuit to detect whether a voltage applied to the first voltage input exceeds a first predetermined value;
   a first configuration circuit coupled to the first detection circuit, the first configuration circuit to configure the programmable logic device to receive a current sufficient for program and erase operations through the first voltage input in response to the first detection circuit detecting that the voltage exceeds the first predetermined value;

a second detection circuit coupled to the first voltage input, the second detection circuit to detect whether the voltage applied to the first voltage input is less than a second predetermined value; and a second configuration circuit coupled to the first and second detection circuits and the second voltage input, the first configuration circuit to configure the programmable logic device to not receive the current sufficient for program and erase operations through the first voltage input in response to the first detection circuit detecting that the voltage applied to the first voltage input does not exceed the first predetermined value, the second configuration circuit to configure the programmable logic device to not receive the current sufficient for program and erase operations through the second voltage input in response to the second detection circuit detecting that the voltage applied to the first voltage input is less that the second predetermined value.

2. The programmable logic device of claim 1, the second configuration circuit to configure the programmable logic device to receive the current sufficient for program and erase operations through the second voltage input in response to the first detection circuit detecting that the voltage does not exceed the first predetermined value and in further response to the second detection circuit detecting that the voltage is not less than the second predetermined value.

3. The programmable logic device of claim 2 wherein the first predetermined value is approximately 8 V.

4. The programmable logic device of claim 3 wherein the second predetermined value is approximately 1 V.

5. A programmable logic device, comprising:

first means for receiving a voltage;

means for detecting whether the voltage exceeds a first predetermined value;

means for detecting whether the voltage is less than a second predetermined value;

means for configuring the programmable logic device to receive a current sufficient for program and erase operations through the first means for receiving the voltage in response to the means for detecting whether the voltage exceeds the first predetermined value detecting that the voltage exceeds the first predetermined value; and means for preventing program and erase operations in response to the means for detecting whether the voltage is less than the second predetermined value detecting that the voltage is less than the second predetermined value.

6. The programmable logic device of claim 5 further comprising:

second means for receiving the voltage; and means for configuring the programmable logic device to receive the current sufficient for program and erase operations through the second means for receiving the voltage in response to the means for detecting whether the voltage is less than the second predetermined value detecting that the voltage is not less than the second predetermined value.

7. The programmable logic device of claim 6 wherein the first predetermined value is approximately 8 V.

8. The programmable logic device of claim 7 wherein the second predetermined value is approximately 1 V.

9. A method for automatically configuring a first voltage input and a second voltage input of a programmable logic device, the method comprising:

detecting whether a voltage applied to the first voltage input exceeds a first predetermined value;

detecting whether a voltage applied to the first voltage input is less than a second predetermined value;

enabling the first voltage input to conduct a current sufficient for program and erase operations if the voltage exceeds the first predetermined value; and configuring the programmable logic device to prevent program and erase operations if the voltage applied to the first voltage input is less than the second predetermined value.

10. The method of claim 9, further comprising:

enabling the second voltage input to conduct the current sufficient for program and erase operations if the voltage does not exceed the first predetermined value and if the voltage is not less than the second predetermined value.

11. A computer system, comprising:

a programmable logic device including a first voltage input, a second voltage input, a first detection circuit coupled to the first voltage input, the first detection circuit to detect whether a voltage applied to the first voltage input exceeds a first predetermined value, a first configuration circuit coupled to the first detection circuit, the first configuration circuit to configure the programmable logic device to receive a current sufficient for program and erase operations through the first voltage input in response to the first detection circuit detecting that the voltage exceeds the first predetermined value, a second detection circuit coupled to the first voltage input, the second detection circuit to detect whether the voltage applied to the first voltage input is less than a second predetermined value, and a second configuration circuit coupled to the first and second detection circuits and the second voltage input, the first configuration circuit to configure the programmable logic device to not receive the current sufficient for program and erase operations through the first voltage input in response to the first detection circuit detecting that the voltage applied to the first voltage input does not exceed the first predetermined value, the second configuration circuit to configure the programmable logic device to not receive the current sufficient for program and erase operations through the second voltage input in response to the second detection circuit detecting that the voltage applied to the first voltage input is less that the second predetermined value;

a power supply coupled to the second voltage input; and a logic device coupled to the first voltage input to provide a write protect signal.

\* \* \* \* \*